United States Patent

Van Den Plassche

[15] 3,671,877

[45] June 20, 1972

[54] PUSH-PULL AMPLIFIER

[72] Inventor: Rudy Johan Van Den Plassche, Emmasingel, Eindhoven, Netherlands

[73] Assignee: U.S. Philips Corporation, New York, N.Y.

[22] Filed: Oct. 9, 1970

[21] Appl. No.: 79,408

[30] Foreign Application Priority Data

Oct. 13, 1969 Netherlands..........................6915478

[52] U.S. Cl. ..............................................330/30 D, 330/18
[51] Int. Cl...............................................................H03f 3/68
[58] Field of Search ..........................................330/15, 30 D

[56] References Cited

UNITED STATES PATENTS 3,142,807 7/1964 Sharma....................................330/15

*Primary Examiner*—Nathan Kaufman
*Attorney*—Frank R. Trifari

[57] ABSTRACT

A low-resistance push-pull amplifier in which the inclusion of a diode in the emitter lead and of transistors in the base leads of the amplifier provides a very high discrimination factor, while additional current sources for the quiescent current adjustment of the transistors may be dispensed with.

2 Claims, 2 Drawing Figures

INVENTOR.
RUDY J. VAN DEN PLASSCHE
BY
Frank R. Trifari
AGENT

PUSH-PULL AMPLIFIER

The invention relates to a low resistance differential amplifier in which the push-pull signal currents are supplied to the bases of two input-transistors having a common emitter impedance.

The invention is to be used in particular in integrated circuits, in which the number of transistors and diodes is not as important as the number of resistors, while inductances and transformers are entirely, and capacitors preferably, to be avoided.

It is an object of the present invention to provide a low-resistance differential amplifier which has a high discrimination factor i.e. a high ratio between the sensitivity to difference signals and common-mode signals- and is also capable of handling large common-mode signals.

The invention is characterized in that the common emitter impedance is at least one diode which is included in a branch parallel to two branches which include the base emitter paths of two further transistors, the collectors of the further transistors being connected to the bases of the input-transistor.

The invention is based on the recognition that the further transistors can only conduct the common-mode component of the input-signal current, so that no special steps need to be taken for the quiescent current adjustment of the input-transistors and at the same time a high discrimination factor is obtained.

The further transistors and the diode included in the common emitter lead of the input-transistors per force will have the same base emitter voltage. If the further transistors have the same emitter areas, they will conduct the same current, namely the common-mode signal current supplied to the input terminals of the circuit. The current flowing through the diode is still dependent on the size of the emitter area of this diode, but it always is equal to the common-mode component of the input signal multiplied by a constant factor. Consequently, this diode current may act direct as a bias current for the input-transistors, dispensing with the need for an additional current source and any associated resistors.

The values of the quiescent currents may be adjusted by choosing the size of the emitter area of the diode. In order to obtain a wide range of bias quiescent adjustment several diodes may be connected in parallel, and in this case also the size of the emitter area of each diode may freely be chosen.

The difference signal currents supplied to the input terminals of the circuit cannot flow through the further transistors and hence perforce act as base currents for the input-transistors. Hence, these difference signal currents undergo an amplification by a factor equal to the current amplification by a factor equal to the current amplification of the input-transistors. Thus, the discrimination factor of the circuit may be very large.

The circuit has two advantages in that the use of resistors can be fully dispensed with, since there is no need for additional current sources, and in that a large discrimination factor is obtainable.

The circuit further is highly suited to be extended so as to increase the bandwidth, as will be described in greater detail hereinafter with reference to the Figures. Moreover the advantage is obtained that at high frequencies only one time constant is effective.

Embodiments of the invention will now be described, by way of example, with reference to the accompanying drawing, in which.

Figure 1:
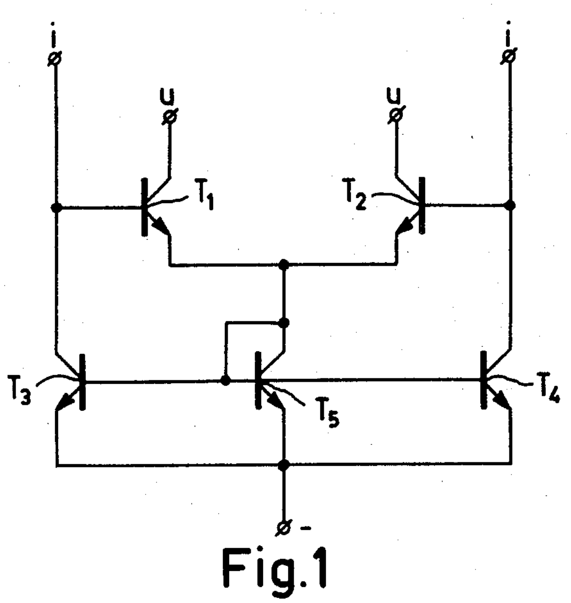
FIG. 1 is the diagram of a circuit according to the invention.

Referring now to FIG. 1, a differential amplifier includes transistors $T_1$and $T_2$having their bases connected to input terminals *i* and their collectors to output terminals *u*. The common emitter of these transistors is connected to the supply source through a transistor $T_5$ connected as a diode. The base emitter paths of two further transistors $T_3$ and $T_4$are connected in parallel with this diode, while the collectors of these transistors are connected to the bases of $T_1$and $T_2$, respectively.

Because the transistors $T_3$and $T_4$have a common base and a common emitter, their base emitter voltages are equal. Hence, if they have equal emitter areas they will perforce carry equal currents. When signal currents are supplied to the input terminals of the circuit, these transistors will only conduct the common-mode component of these signal currents.

The base emitter voltage of the diode $T_5$also will be equal to those of the said transistors. If the size of the emitter area of this diode is equal to that of each of the transistors $T_3$and $T_5$, the current through the diode will also be equal to the common-mode component of the input signal currents. Hence, the current through this diode may be used as such for the quiescent current adjustment of the transistors $T_1$and $T_2$. This quiescent current may be adjusted to any desired value by the choice of the emitter area of the diode $T_5$relative to that of each of the transistors $T_3$and T. The range of the quiescent current adjustment will increase with increase in the emitter area of $T_5$. Obviously, to increase the range of the quiescent current adjustment the diode $T_5$may be replaced by a parallel arrangement of several diodes, while retaining the possibility of choosing the emitter area of each diode.

This quiescent current for the transistors $T_1$and $T_2$may alternatively be adjusted by including a resistor between the common emitter lead of $T_3$and $T_4$and the supply source and, as the case may be, another resistor in the emitter lead of $T_5$. However, if the circuit is integrated, the latter method has disadvantages due to the presence of resistors and to the face that no longer a common emitter can be used for $T_3$, $T_4$and $T_5$.

The difference signal currents supplied to the input terminals cannot pass the transistors $T_3$and $T_4$and hence perforce act as base currents for the transistors $T_1$and $T_2$. Thus, these difference signal currents are amplified by a factor equal to the current amplification of the relevant transistors. As a result, the amplification of the difference signal will be far greater than that of the common-mode signal, so that a very high discrimination factor is achieved.

Figure 2:
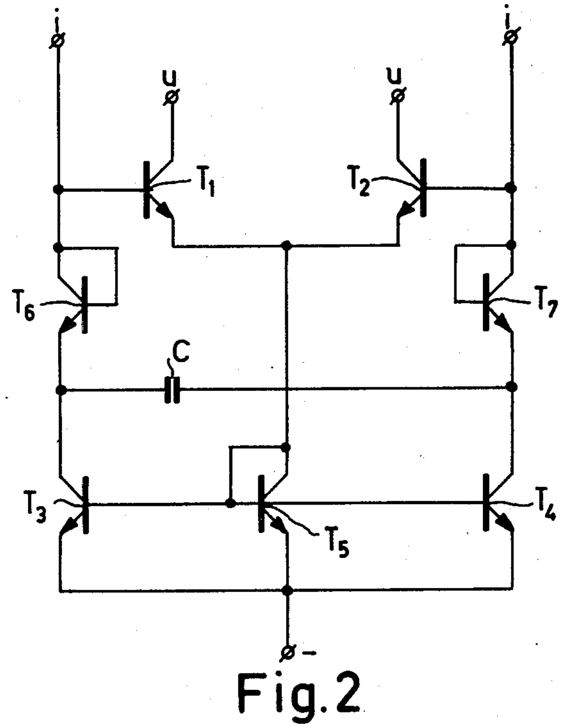
FIG. 2 is a diagram of an extended form thereof.

The circuit may readily be extended to form the circuit shown in Figure 2. In this circuit diodes $T_6$and $T_7$the emitters of which are interconnected through a capacitor C are included between the base of $T_1$and the collector $T_3$and between the base of $T_2$and the collector of $T_4$, respectively.

For low frequencies, at which the capacitor C has a large impedance, the circuit operates identically to that shown in Figure 1. For high frequencies, however, the capacitor C forms a bypass for the difference signal currents, so that these currents will no longer act as base currents or $T_1$and $T_2$. The difference currents now will flow through the diodes $T_6$and $T_7$, which together with the transistors $T_1$and $T_2$will form a current amplifier, the amplification factor being determined by the quotient of the bias currents of the transistors of the diodes. With equal bias currents the current amplification will be unity at high frequencies. Thus, the behavior of the circuit at high frequencies is determined by the value of the capacitor. Also, at high frequencies one time constant only will play a significant part, for the frequency dependence of the current amplification of $T_1$and $T_2$has been eliminated.

What is claimed is:

1. A low-resistance differential amplifier, comprising a first transistor having an emitter, a base and a collector, a second transistor having an emitter, a base and a collector, a diode, means for connecting the emitters of the first and second transistors to a source of constant potential through the diode, a third transistor having a base, a collector and an emitter, a fourth transistor having a base, a collector and an emitter, means for connecting the base and emitter of both the third and fourth transistors in parallel with the diode, means for connecting the collector of the third transistor to the base of the first transistor, means for connecting the collector of the fourth transistor to the base of the second transistor, the base of the first transistor thereby comprising a first input to the differential amplifier, the base of the second transistor thereby comprising a second input to the differential amplifier, and the collectors of the first and second transistors thereby forming outputs of the differential amplifier.

2. A differential amplifier as claimed in claim 1, wherein the means for connecting the collector of the third transistor to the base of the first transistor comprises a second diode, wherein the means for connecting the collector of the fourth transistor to the base of the second transistor comprises a third diode, the amplifier further comprising a capacitor, and means for connecting the collector of the third transistor to the collector of the fourth transistor through the capacitor.

* * * * *